(12) United States Patent
Kobayashi

(10) Patent No.: US 7,757,134 B2
(45) Date of Patent: Jul. 13, 2010

(54) TEST APPARATUS FOR TESTING A MEMORY AND ELECTRONIC DEVICE HOUSING A CIRCUIT

(75) Inventor: Shinichi Kobayashi, Tokyo (JP)

(73) Assignee: Advantest Corporation (JP)

( * ) Notice: Subject to any disclaimer, the term of this patent is extended or adjusted under 35 U.S.C. 154(b) by 282 days.

(21) Appl. No.: 11/857,447

(22) Filed: Sep. 19, 2007

(65) Prior Publication Data

US 2008/0235540 A1  Sep. 25, 2008

Related U.S. Application Data

(63) Continuation of application No. PCT/JP2007/056071, filed on Mar. 23, 2007.

(51) Int. Cl.
*G11C 29/00* (2006.01)
(52) U.S. Cl. ........................ 714/719; 714/723
(58) Field of Classification Search ................. 714/719, 714/723
See application file for complete search history.

(56) References Cited

U.S. PATENT DOCUMENTS

| 5,996,098 | A * | 11/1999 | Takano | 714/723 |
|---|---|---|---|---|
| 6,138,257 | A * | 10/2000 | Wada et al. | 714/724 |
| 6,880,117 | B2 * | 4/2005 | Lin et al. | 714/718 |
| 6,910,155 | B2 * | 6/2005 | Ku | 714/30 |
| 7,137,055 | B2 * | 11/2006 | Hirano et al. | 714/738 |
| 7,159,145 | B2 * | 1/2007 | Wang et al. | 714/36 |

FOREIGN PATENT DOCUMENTS

| JP | 04-194682 | 7/1992 |
|---|---|---|
| JP | 08-185700 | 7/1996 |
| JP | 09-080122 | 3/1997 |
| JP | 2000-222899 | 8/2000 |
| JP | 2001-357696 | 12/2001 |
| JP | 2002-278849 | 9/2002 |
| JP | 2005-259265 | 9/2005 |
| JP | 2005-259266 | 9/2005 |
| JP | 2007-102940 | 4/2007 |

* cited by examiner

*Primary Examiner*—James C Kerveros
(74) *Attorney, Agent, or Firm*—Chen Yoshimura LLP

(57) ABSTRACT

A test apparatus for testing a memory under test is provided, including a pattern generator generating a read address from which data is read from the memory under test and an expected value of the data read from the read address, a logical comparator comparing the read data read from the read address of the memory under test to the expected value and outputting fail data indicating pass/fail of every bit of the read data, a first fail memory storing a grouping of the read address and the fail data in a case where the read data and the expected value are not the same, a second fail memory storing fail data concerning addresses corresponding to each address of the memory under test, and an updating section updating fail data stored in the second fail memory and corresponding to the read address based on the grouping of the address and the fail data read from the first fail memory.

22 Claims, 7 Drawing Sheets

| READ ADDRESS | FAIL DATA | | | | | | | |
|---|---|---|---|---|---|---|---|---|
| | 1 | 2 | 3 | 4 | 5 | 6 | 7 | 8 |
| 0001 | P | P | P | F | P | P | P | P |
| 0100 | P | F | P | P | P | P | P | P |
| 1001 | P | P | F | F | P | P | P | P |
| ⋮ | | | | | | | | |
| 0100 | F | P | P | P | P | P | P | P |
| ⋮ | | | | | | | | |

| MEMORY ADDRESS | READ ADDRESS DATA | FAIL DATA |
|---|---|---|
| XXXXX | ............ | ............ |
| ⋮ | | |
| | ADDRESS FAIL | |
| YYYYY | ........................ ||
| ⋮ | | |

30 (top section), 50 (bottom section)

FIG. 6

TEST APPARATUS FOR TESTING A MEMORY AND ELECTRONIC DEVICE HOUSING A CIRCUIT

CROSS REFERENCE TO RELATED APPLICATION

This is a continuation application of PCT/JP2007/56071 filed on Mar. 23, 2007, the contents of which are incorporated herein by reference.

BACKGROUND

1. Technical Field

The present invention relates to a test apparatus and an electronic device and, more particularly, the present invention relates to a test apparatus testing a memory under test and an electronic device housing a test circuit.

2. Related Art

Conventionally, as a test of a memory under test such as a semiconductor memory, a test is known to judge pass/fail of each memory cell by writing a prescribed logic value to each memory cell of the memory under test, reading the written logic value, and comparing the written logic value to an expected value. Pass/fail information of the memory cell is stored in a fail memory of the test apparatus.

The fail memory includes a plurality of memory cells corresponding one-to-one with a plurality of memory cells of the memory under test and stores pass/fail information of each memory cell of the memory under test in the corresponding memory cell included therein (see, e.g., Patent Document 1 and Patent Document 2). In such a case, writing of the pass/fail information to the fail memory is executed through a read-modify-write operation.

Patent Document 1: Unexamined Japanese Patent Application Publication No. 2005-259265

Patent Document 2: Unexamined Japanese Patent Application Publication No. 2005-259266

In recent years, a significant increase in a capacity of semiconductor memories has been accompanied by an increase in testing time. Because of this, it is desirable to shorten the testing time. In conventional testing, however, even in a case where each memory cell is either pass or fail, pass/fail information in the test is written to the memory cell of the corresponding fail memory through a read-modify-write operation. Because of this, the writing of the pass/fail information to the fail memory is greatly increased relative to the increased capacity of the semiconductor memory.

SUMMARY

Therefore, it is an object of an aspect of the present invention to provide a test apparatus and an electronic device, which are capable of overcoming the above drawbacks accompanying the related art. The above and other objects can be achieved by combinations described in the independent claims. The dependent claims define further advantageous and exemplary combinations of the present invention.

To solve the aforementioned problems, according to a first aspect related to the innovations herein, one exemplary apparatus may include a test apparatus for testing a memory under test. Such a test apparatus includes a pattern generator generating a read address from which data is read from the memory under test and an expected value of the read data read from the read address of the memory under test, a logical comparator comparing read data read from the read address of the memory under test to the expected value and outputting fail data pass/fail of every bit of the read data, a first fail memory storing a grouping of the read address and the fail data in a case where the read data is not identical to the expected value, a second fail memory storing fail data concerning addresses corresponding to each address of the memory under test, and a updating section updating fail data stored in the second fail memory and corresponding to the read address based on the grouping of the read address and the fail data read from the first fail memory.

According to a second aspect related to the innovations herein, one exemplary device may include an electronic device which includes a memory circuit operating according to a signal input into a device during operation of the device and a test circuit for testing the memory circuit. The test circuit of the electronic device includes a pattern generator generating a read address from which data is read from the memory circuit and an expected value of the read data read from the read address of the memory circuit, a logical comparator comparing read data read from the read address of the memory circuit to the expected value and outputting fail data pass/fail of every bit of the read data, a first fail memory storing a grouping of the read address and the fail data in a case where the read data is not identical to the expected value, a second fail memory storing fail data concerning addresses corresponding to each address of the memory circuit, and a updating section updating fail data stored in the second fail memory and corresponding to the read address based on the grouping of the read address and the fail data read from the first fail memory.

The summary clause does not necessarily describe all necessary features of the embodiments of the present invention. The present invention may also be a sub-combination of the features described above. The above and other features and advantages of the present invention will become more apparent from the following description of the embodiments taken in conjunction with the accompanying drawings.

BRIEF DESCRIPTION OF THE DRAWINGS

FIG. 2 shows an example of fail information stored in a first fail memory 30.

FIG. 6 describes an example of a memory device functioning as the first fail memory 30 and the second fail memory 50.

DESCRIPTION OF EXEMPLARY EMBODIMENTS

Hereinafter, an embodiment of the present invention will be described. The embodiment does not limit the invention according to the claims, and all the combinations of the features described in the embodiment are not necessarily essential to means provided by aspects of the invention.

Figure 1:
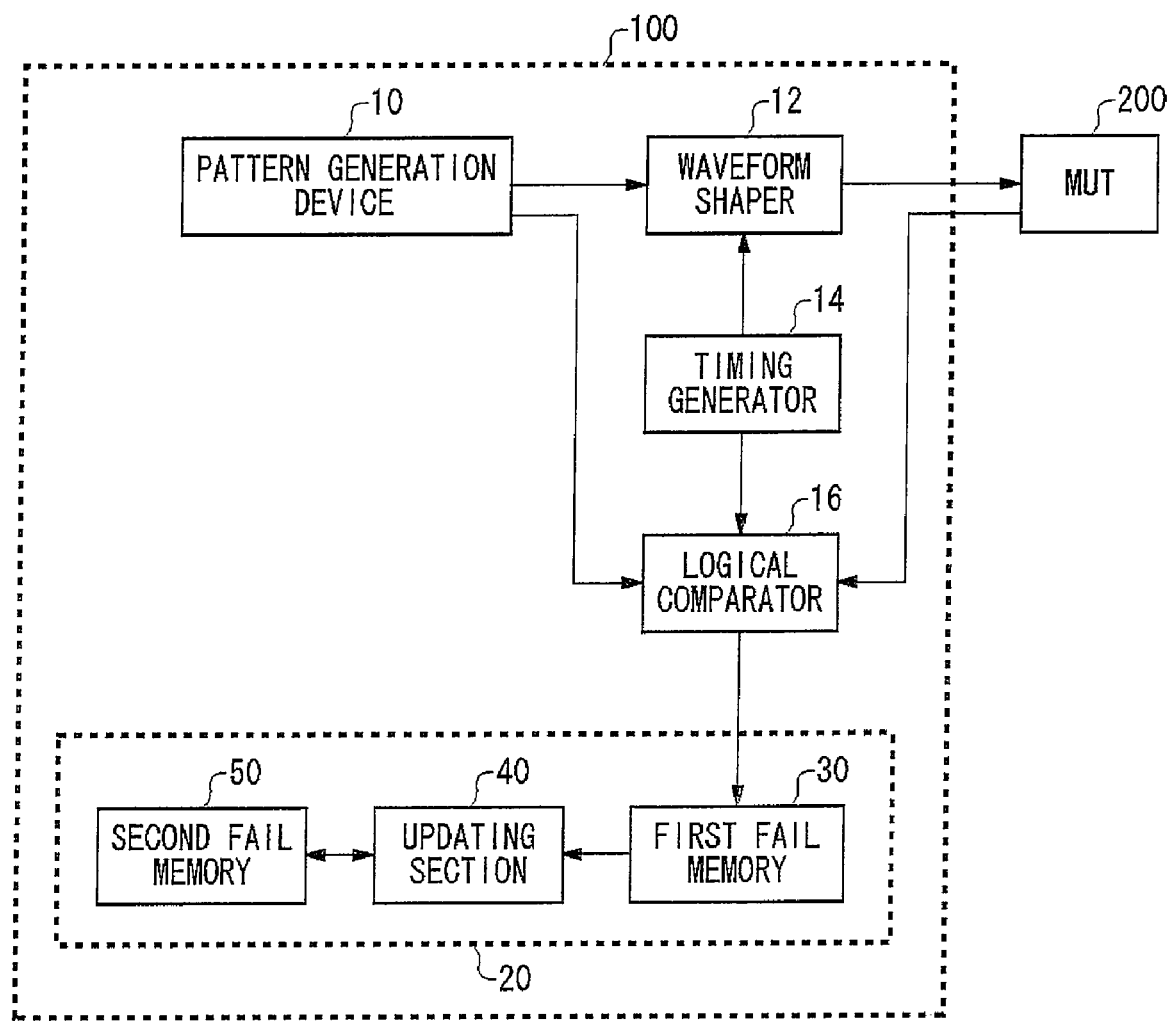
FIG. 1 shows an example configuration of a test apparatus 100 according to an embodiment of the present invention.

FIG. 1 shows an example configuration of a test apparatus 100 according to an embodiment of the present invention. The test apparatus 100 is an apparatus for testing a memory under test 200 such as a semiconductor memory and is provided with a pattern generator 10, a waveform shaper 12, a timing generator 14, a logical comparator 16, and a pass/fail information storage section 20.

The pattern generator 10 generates a test pattern for testing the memory under test 200 based on a supplied test program. For example, in a case where test data is written to the memory under test 200, the pattern generator 10 may generate a test pattern including an address of the memory under test 200 to which the test data is to be written, a logic value of the test data written to the aforementioned address, and control data for controlling the memory under test 200 to be in a writable condition. Furthermore, in a case where the test data written to the memory under test 200 is read, the pattern generator 10 may generate a test pattern including an address of the memory under test 200 from which the test data is to be read, an expected value of the read data, and control data for controlling the memory under test 200 to be in a readable condition. The pattern generator 10 may use logic data written to each address as expected value data. The pattern generator 10 may sequentially generate a plurality of test patterns employing a plurality of tests by sequentially executing a plurality of test programs.

The waveform shaper 12 forms a test signal input into the memory under test 200 based on the test pattern supplied from the pattern generator 10. For example, the waveform shaper 12 may form a test signal by sequentially outputting, in accordance with a provided timing signal, voltages corresponding to logic values of the test pattern. The waveform shaper 12 may form as the test signal an address signal, a test data signal, a control signal, or the like.

The logical comparator 16 compares read data read from the memory under test 200 to the expected values. For example, the logical comparator 16 may sequentially compare a logic value of each bit of the read data to the corresponding expected value. Each bit of the read data may correspond to each memory cell of the memory under test 200. The logical comparator 16 may detect the logic value of each bit by detecting, in accordance with a supplied strobe signal, the logic values of the read data from the memory under test 200. For every bit of read data, the logical comparator 16 may output fail information showing whether the logic value is the same as or different than the expected value.

Furthermore, the logical comparator 16 may generate fail information for every address of the memory under test 200. For example, in a case where the memory under test 200 includes a memory cell with a plurality of bits in a single address, the logical comparator 16 may include a number of channels corresponding to the plurality of bits. The logical comparator 16 may generate fail information including a read address showing the address from which the data is read and fail data of the plurality of bits showing the pass/fail of each memory cell of the aforementioned address.

The pass/fail information storage section 20 stores the fail information output by the logical comparator 16. The pass/fail information storage section 20 includes a first fail memory 30, an updating section 40, and a second fail memory 50.

The first fail memory 30 stores the fail memory for each test. For example, in a case where the read data and the expected value are not identical, the first fail memory 30 stores the corresponding read address and the fail data as a group. Specifically, in a case where one of the bits indicates "fail" in the fail information output by the logical comparator 16, the first fail memory 30 may store the read address and the fail data included in the fail information. Furthermore, a storage area of the first fail memory 30 may be smaller than a storage area of the memory under test 200.

The first fail memory 30 may use an interposed high speed cache memory to acquire the fail information in real time during testing of the memory under test 200. Furthermore, the fail information stored in the first fail memory 30 is accumulated in the second fail memory 50. For example, the fail information stored in the first fail memory 30 may be cumulatively added into the second fail memory 50 every time one of the tests is completed. Furthermore, the fail information stored in the first fail memory 30 may be cumulatively added into the second fail memory 50 at prescribed times during testing. In a case where the high speed cache memory is provided, a memory with lower speed may be used as the first fail memory 30.

The second fail memory 50 stores fail information about each address of the memory under test 200. For example, the second fail memory 50 may store fail data about the address for every address of the memory under test 200. The second fail memory 50 may include a storage area of a size equal to that of the memory under test 200. The second fail memory 50 may include a storage area of a size larger than that of the first fail memory 30. The second fail memory 50 may be a low speed memory.

For example, the second fail memory 50 may include addresses corresponding one-to-one with each address of the memory under test 200. Furthermore, the number of bits of each address of the second fail memory 50 may be the same as the number of bits of each address of the memory under test 200.

The updating section 40 accumulatively adds to the fail information stored in the second fail memory 50 based on the fail information stored in the first fail memory 30. As described above, the updating section 40 may update the failed information stored in the second fail memory 50 at a time when each test is finished or at prescribed times during testing. Here, the prescribed times during testing may be times that do not interfere with storage of the fail information in the first fail memory 30, for example.

The updating section 40 may accumulatively add the fail data included in the fail information to an corresponding address of the second fail memory 50 based on the read address included in each piece of fail information stored in the first fail memory 30. For example, the updating section 40 may update the fail information of the second fail memory 50 through a read-modify-write operation.

Specifically, the updating section 40 may read the fail data of the address of the second fail memory 50 corresponding to the read address included in the fail information stored in the first fail memory 30. The updating section 40 may then obtain each logical sum of the bits corresponding to each other between the fail data of the fail information and the fail data read from the second fail memory 50. The process for obtaining the logical sums of the corresponding bits may be a process in which the logical sum of two corresponding bits is "fail" in a case where at least one of the bits indicates "fail" (error). Through such a process, the updating section 40 can overwrite onto the addresses of the second fail memory 50 the new accumulatively added fail data concerning each of the bits.

Through such a process, in a case where testing is performed with a plurality of testing conditions, fail data can be accumulated wherein a memory cell in which a "fail" is detected in any one of the tests is determined to be defective. Furthermore, because the read-modify-write process is not performed in real time, a low speed memory can be used as the second fail memory 50 having a capacity equal to that of the memory under test 200.

FIG. 2 shows an example of fail information stored in the first fail memory 30. As described above, the first fail memory 30 sequentially stores groupings of fail data and a read address in which the "fail" occurs in one of the bits in the fail data of, for example, eight bits. In the present embodiment, the memory under test 200 includes an eight bit memory cell for each of the addresses. The read addresses may be thirty bits, for example.

In a case where all of the bits of the fail data are "pass" (P), the fail information is not stored in the first fail memory 30. Generally, the frequency of "fail" occurrence is low. Because of the low frequency, the first fail memory 30 may have a storage area smaller than the memory under test 200. Furthermore, the amount of data written to the first fail memory 30 in real time during the testing can be decreased. Yet further, a low speed memory can be used as the first fail memory 30 by interposing in advance the high speed cache memory.

Figure 3:
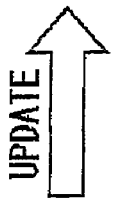
FIG. 3 describes an example of an operation updating a second fail memory 50.

FIG. 3 describes an example of the operation updating the second fail memory 50. FIG. 3 shows an example of updating the second fail memory 50 using the fail information shown in FIG. 2. As described above, through the read-modify-write operation, the updating section 40 updates the fail information of the second fail memory 50 using each piece of fail information stored in the first fail memory 30.

For example, the updating section 40 reads from the first fail memory 30 the read address "0001" and the fail data "PPPFPPPP" shown in FIG. 2. The updating section 40 then reads from the second fail memory 50 the fail data "PPPPP-PPP" if the address "0001" corresponding to the read address "0001." The updating section 40 then obtains the logical sums of corresponding bits in the two sets of fail data and generates the new fail data "PPPFPPPP." The generated fail data is then written to the address "0001" of the second fail memory 50. The updating section 40 updates the second fail memory 50 by performing such a process for each piece of fail information stored in the first fail memory 30.

Figure 4:
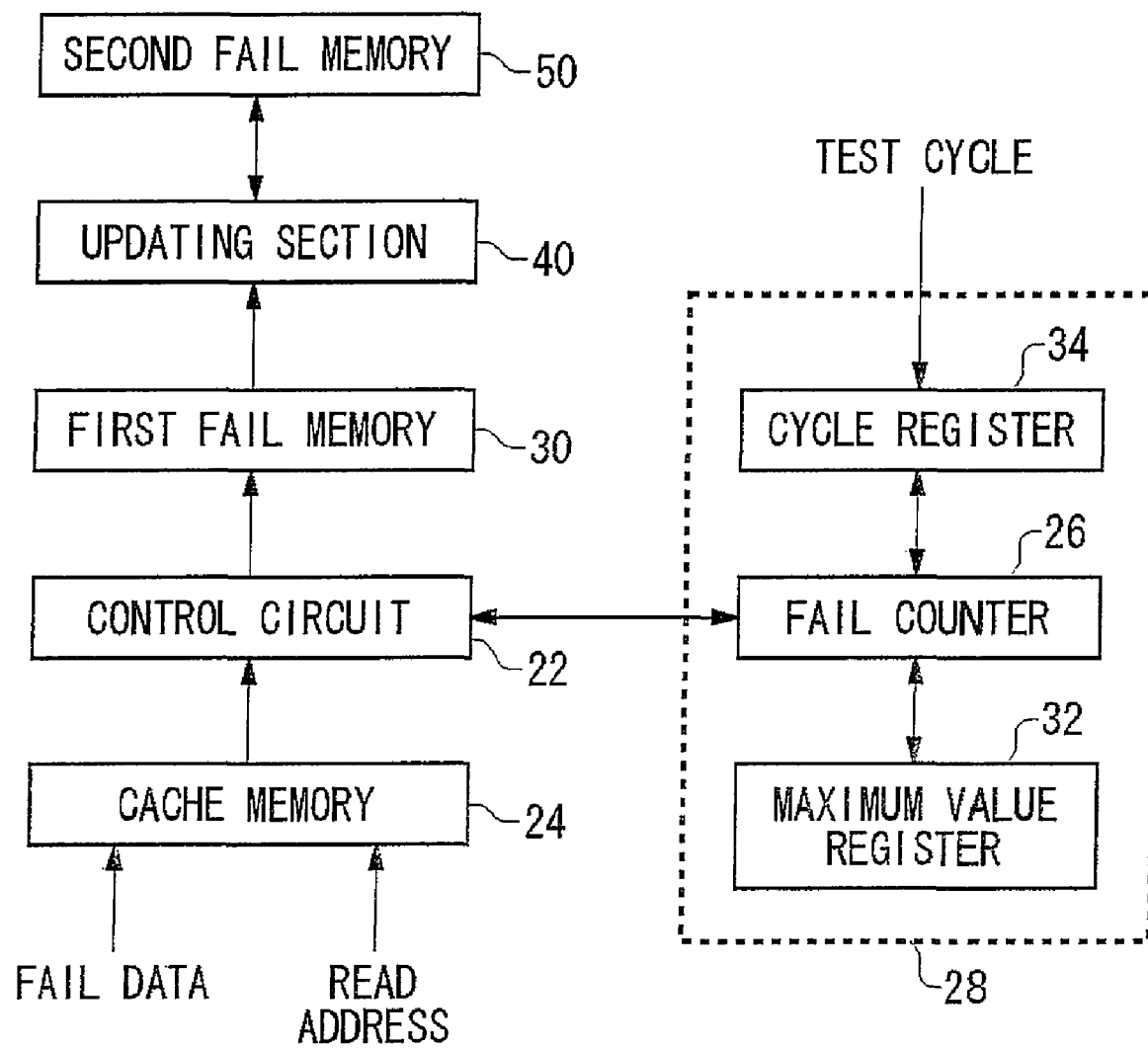
FIG. 4 shows an example of a detailed configuration of a pass/fail information storage section 20.

FIG. 4 shows an example of a detailed configuration of the pass/fail information storage section 20. The pass/fail information storage section 20 includes the first fail memory 30, the updating section 40, the second fail memory 50, a control circuit 22, a cache memory 24, and a storage control section 28. The storage control section 28 includes a fail counter 26, a maximum value register 32, and a cycle register 34. The first fail memory 30, the updating section 40, and the second fail memory 50 may be identical to the structural elements described using the same numbering in FIGS. 1 to 3. The updating section 40 may include an address pointer, not shown, for the first fail memory 30. The updating section 40 may access the first fail memory 30 through the address pointer and sequentially read the fail information to perform the updating process.

The cache memory 24 is a high speed buffer memory having a low capacity (such as a FIFO) disposed between the logical comparator 16 and the control circuit 22. The cache memory 24 sequentially stores as fail information the fail data output by the logical comparator 16 and the address data from the pattern generator 10. The control circuit 22 sequentially reads the fail information stored in the cache memory 24. In a case where the control circuit 22 reads the fail information from the cache memory 24, the storage area of the cache memory 24 may be freely set.

The control circuit 22 sequentially stores in empty addresses of the first fail memory 30 the fail information read from the cache memory 24.

The fail counter 26 counts the number of pieces of fail information stored in the first fail memory 30 by the control circuit 22. The fail counter 26 prohibits storage of the fail information in the first fail memory 30 from the control circuit 22 on a condition that a count value, representing the counted number of pieces of fail information, reaches a predetermined maximum value. The maximum value may be may be set according to the number of addresses included in the first fail memory 30, for example. Furthermore, the maximum value may be set in advance in the maximum value register 32.

Through such an operation, in a case where there is no remaining storage capacity in the first fail memory 30 or the remaining storage capacity is less than a prescribed amount, loss of fail information already stored in the first fail memory 30 can be prevented because the new writing of subsequent fail information onto the first fail memory 30 is prohibited. In other words, in the first fail memory 30, the writing of new fail information over fail information which is not yet reflected in the second fail memory 50 is prevented.

Furthermore, the cycle register 34 may store a test cycle of a test in which writing to the first fail memory 30 is prohibited, so that fail information in the following test cycles cannot be written to the first fail memory 30. Therefore, after the fail information of the second fail memory 50 is updated using the fail information stored in the first fail memory 30, the storage control section 28 may clear the storage area of the first fail memory 30 and make the pattern generator 10 again perform the test program corresponding to the test.

The storage control section 28 may control the control circuit 22 to resume writing of the fail information to the first fail memory 30 on a condition that the test cycle of the test performed again has once again reached the test cycle held in the cycle register 34. Therefore, storage of the subsequent fail information in the first fail memory 30 is allowed, so that the fail information which was prohibited from being stored in the first fail memory 30 during the previous test performance can now be stored in the first fail memory 30.

For example, in a case where the count value is greater than or equal to the maximum value, the fail counter 26 outputs an enabling signal prohibiting writing to the first fail memory 30, and in a case where the count value is less than the maximum value, the fail counter 26 outputs an enabling signal allowing writing to the first fail memory 30. In a case where the test cycle of the test performed again has once again reached the test cycle held in the cycle register 34, the cycle register 34 may reset the count value of the fail counter 26 to an initial value. Therefore, writing to the first fail memory 30 is permitted, so that the fail information can be written to the first fail memory 30 until the number of pieces of written fail information again reaches the maximum value.

Figure 5:
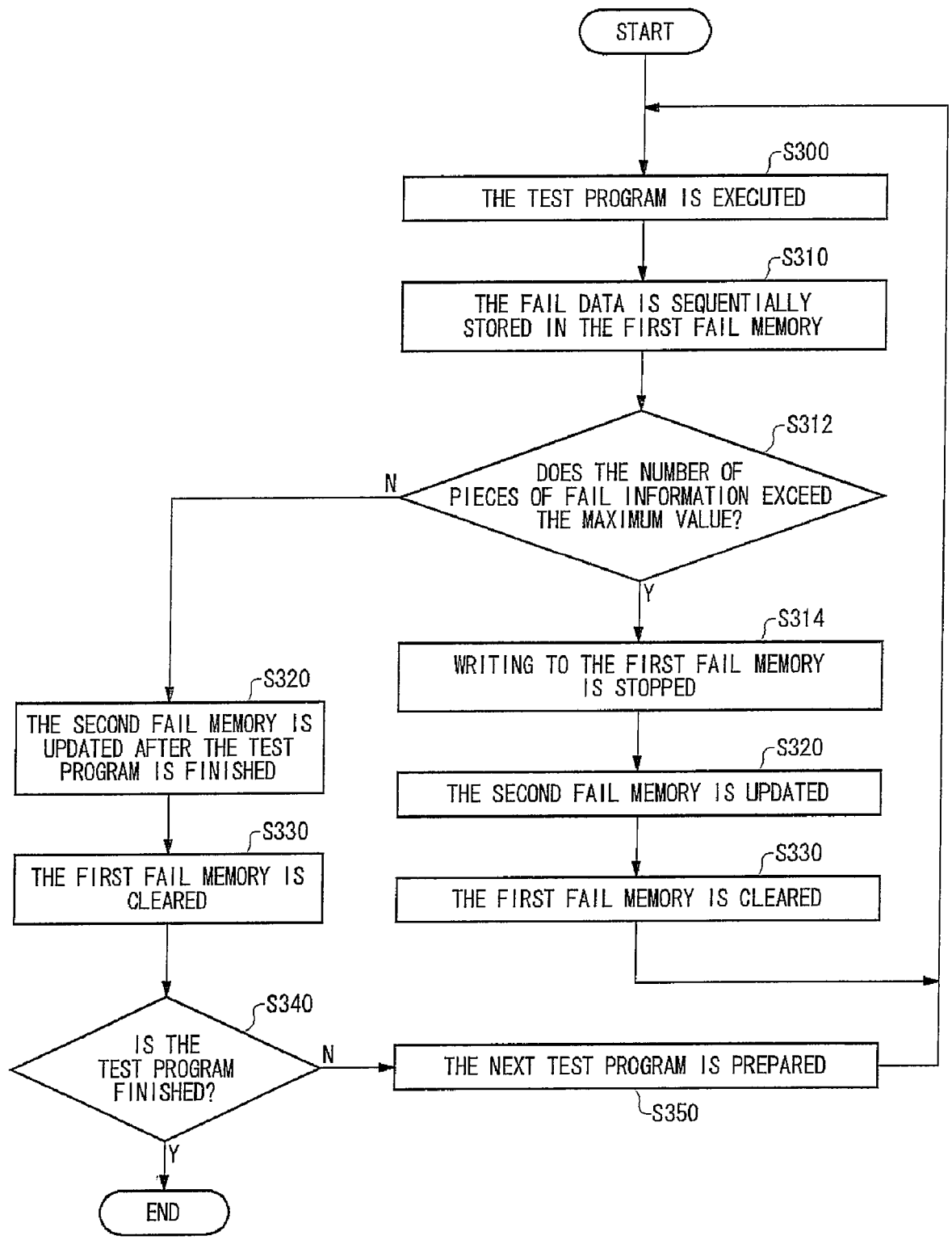
FIG. 5 is a flow chart showing an example of an operation of the test apparatus 100 described in FIGS. 1 to 4.

FIG. 5 is a flow chart showing an example of an operation of the test apparatus 100 described in FIGS. 1 to 4. By performing a previously set test program, the test apparatus 100 sequentially acquires the fail information concerning each address of the memory under test 200 (S300). In a case where a new test program is performed, it is desirable that the cycle register 34 and the fail counter 26 be reset.

The storage control section 28 receives from the cache memory 24 the fail information indicating that one of the bits of the fail data indicates "fail" and sequentially stores this information in the first fail memory 30 (S310). At this time, the fail counter 26 counts the number of pieces of fail information written to the first fail memory 30.

The fail counter 26 makes a judgment as to whether the count value exceeds the maximum value set by the maximum value register 32 for every incrementation of the count value, for example (S312). In a case where the count value does not exceed the maximum value until the test program is finished, the updating section 40 updates the second fail memory 50 using the fail information of the first fail memory 30 after the test program is finished (S320). Furthermore, after updating the second fail memory 50, the updating section 40 may clear the storage area of the first fail memory 30. The test apparatus 100 then males a judgment as to whether all of the programs are performed (S340). In a case where a program remains to be performed, the next program is prepared and the processes from step S300 are repeated. In a case where no programs remain to be performed, the test is finished.

At S312, in a case where the number of pieces of fail information written to the first fail memory 30 exceed the maximum value, the storage control section 28 stops writing of subsequent fail information to the first fail memory 30 (S314). At this time, the storage control section 28 notifies the pattern generator 10 and the updating section 40 that writing of the fail information concerning the present test program is stopped. In a case where the pattern generator 10 receives the aforementioned notification, performance of the test program may be stopped or the test program may be performed until finished.

The cycle register 34 stores the test cycle in which writing of the fail information is stopped. Notification concerning what number test cycle is being performed may be supplied to the cycle register 34 from the pattern generator 10. At a time when notification is received from the fail counter 26 that writing of the fail information is stopped, the cycle register 34 may store the number of the test cycle being performed supplied from the pattern generator 10.

In a case where notification is received that writing of the fail information is stopped, the updating section 40 sequentially reads the fail information written to the first fail memory 30 and updates the fail information of the second fail memory 50 (S320). In a case where the updating section 40 reads all of the fail information written to the first fail memory 30 and updates the fail information of the second fail memory 50, the updating section 40 may clear the storage area of the first fail memory 30. Furthermore, the updating section 40 may notify the pattern generator 10 that updating of the second fail memory 50 is finished.

After receiving notification that writing of the fail information is stopped, the pattern generator 10, in a case where notification is received that updating of the second fail memory 50 is finished, again performs the same test program (S300). The test apparatus 100 then executes the following processes. Here, it should be noted that in the process of S310 during a second performance and onward of the same test program, in a case where the test cycle of the test program reaches the test cycle held in the cycle register 34, writing of the fail information to the first fail memory 30 is resumed. Through such a process, the fail information of the memory under test 200 can be acquired without interference.

Furthermore, during the processes of S320 and S330, the second fail memory 50 is updated and the first fail memory 30 is cleared every time a test program is finished. As opposed to this, in other examples, the next test program may be executed without clearing the first fail memory 30 after a test program is finished. In other words, the test apparatus 100 may perform a plurality of programs in succession until the number of pieces of fail information written to the first fail memory 30 reaches the maximum value. Through such a process, fail information can be obtained more effectively.

Furthermore, in the case described above, a case can be thought of in which pieces of fail information having identical read addresses are stored in the first fail memory 30. For example, in FIG. 2, two pieces of fail information having a read address of "0100" are stored. In such a case, the updating section 40 may generate new fail data by obtaining the logical sums of the plurality of pieces of fail data corresponding to the read addresses of the first fail memory 30 and the corresponding pieces of fail data in the second fail memory 50. The thusly generated fail data is then written to the second fail memory 50.

Through such a process, the second fail memory 50 can be updated through a single read-modify-write operation performed on the plurality of pieces of fail information in the first fail memory 30. Therefore, the fail information can be accumulated more effectively.

FIG. 6 describes an example of a memory device functioning as the first fail memory 30 and the second fail memory 50. The first fail memory 30 and the second fail memory 50 of the present embodiment may be allocated as different address areas within the same memory device. The memory device may be a low speed and low cost semiconductor memory, such as a DRAM.

In such a case, the control circuit 22 and the updating section 40 may be notified as to which of the address areas of the memory device are allotted to the first fail memory 30 and to the second fail memory 50. The pass/fail information storage section 20 may include a register storing first and last addresses of the address ranges allocated as the first fail memory 30 and the second fail memory 50, respectively. The updating section 40 may include an address pointer used for the first fail memory 30 and an address pointer used for the second fail memory 50, and may be capable of accessing both addresses simultaneously.

In the memory device, the storage capacities allocated for the first fail memory 30 and the second fail memory 50 may both be changeable. It should be noted that the storage capacity allocated as the second fail memory 50 may be allocated to correspond to the memory under test 200.

For example, the test apparatus 100 may set the address range allocated as the second fail memory 50 such that the storage capacity of the second fail memory 50 is equal to the storage capacity of the memory under test 200. The remaining address range of the memory device may then be allocated as the first fail memory 30.

In a case where the first fail memory 30 and the second fail memory 50 are DRAMs, the updating section 40 may burst read the plurality of pieces of pass/fail data from the first fail memory 30 and the second fail memory 50 according to a single reading command. In such a case, the updating section 40 may burst write to the second fail memory 50 the new fail data generated for each piece of read fail information.

Figure 7:
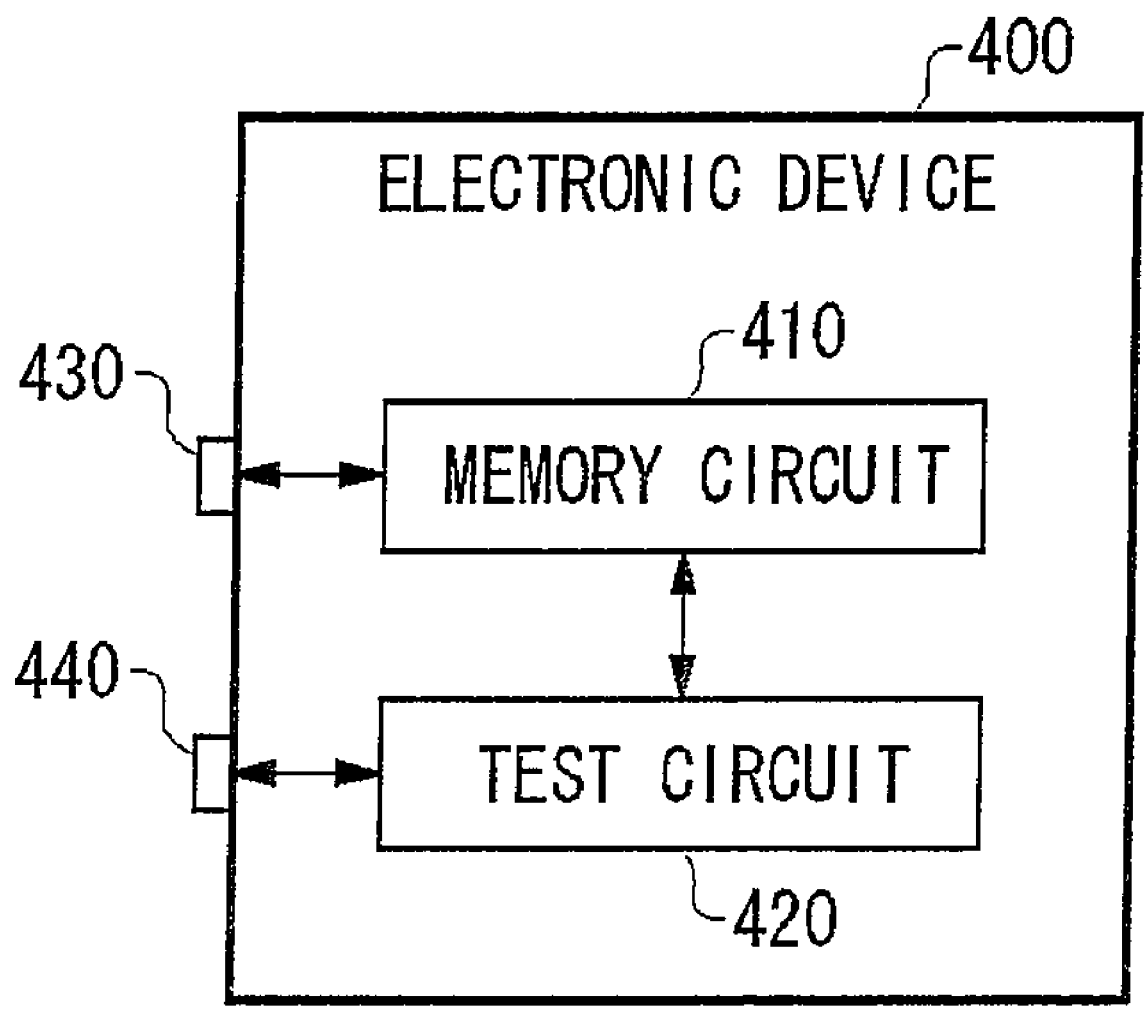
FIG. 7 shows an example configuration of an electronic device 400 BIST (Built In Self Test) aspect according to an embodiment of the present invention.

FIG. 7 shows an example configuration of an electronic device 400 BIST (Built In Self Test) aspect according to an embodiment of the present invention. The electronic device 400 includes a memory circuit 410, a test circuit 420, an input/output pin 430, and a BIST pin 440. The memory circuit 410 may be a circuit operating at a time when the electronic device 400 is implemented (a time of actual operation). The memory circuit 410 operates according to a signal supplied from the input/output pin 430 at a time when the electronic device 400 is implemented.

For example, the memory circuit 410 may be a circuit including a memory device such as the memory device of the memory under test 200 described in FIGS. 1 to 6. The test circuit 420 is disposed on a same semiconductor chip as the memory circuit 410 and tests the memory circuit 410. The test circuit 420 may have a configuration identical to that of the test apparatus 100 described in FIGS. 1 to 6. Furthermore, the test circuit 420 may have a portion of the configuration of the test apparatus 100. The test circuit 420 may be a circuit executing a portion of the functions of the test apparatus 100.

In a case where a signal is supplied from an external test apparatus via the BIST pin 440 giving notification that a self test of the memory circuit 410 is performed, the test circuit 420 may make the memory circuit 410 perform a self test. The BIST pin 440 is a pin which is not used during implementation of the electronic device 400. Furthermore, the test circuit 420 may output a test result of the memory circuit 410 to the external test apparatus via the BIST pin 440.

The external test apparatus 100 may supply to the test circuit 420 a test program, a test pattern, and the like to make the test circuit 420 function in the same manner as the related test apparatus described in FIGS. 1 to 6.

While the embodiment of the present invention has been described, the technical scope of the invention is not limited to the above described embodiment. It is apparent to persons skilled in the art that various alternations and improvements can be added to the above-described embodiment. It is also apparent from the scope of the claims that the embodiments added with such alternations or improvements can be included in the technical scope of the invention.

As made clear from the above description, through one embodiment of the present invention, a test apparatus and a electronic device which can effectively acquire fail information of each address of a memory under test are realized.

What is claimed is:

1. A test apparatus for testing a memory under test, comprising:
   a pattern generator operable to generate a read address from which data is read from the memory under test and an expected value of the read data read from the read address of the memory under test;
   a logical comparator operable to compare read data read from the read address of the memory under test to the expected value and outputting fail data indicating pass/fail of every bit of the read data;
   a first fail memory operable to store a grouping of the read address and the fail data only in a case where the read data is not identical to the expected value;
   a second fail memory operable to store fail data in addresses corresponding to each address of the memory under test; and
   an updating section operable to update fail data stored in the second fail memory and corresponding to the read address based on the fail data read from the first fail memory that is in the same grouping as the read address.

2. The test apparatus according to claim 1, wherein the updating section:
   reads the fail data stored in the second fail memory and corresponding to the read address read from the first fail memory;
   obtains a logical sum of corresponding bits in the fail data read from the first fail memory and the fail data read from the second fail memory and generates new fail data in which a "fail" result is determined where at least one of the bits in the fail data indicates "fail"; and
   writes the new fail data to the read address of the second fail memory.

3. The test apparatus according to claim 2, wherein the updating section executes a comparison of the read data corresponding to a plurality of the read addresses and the expected values and, in a case where a comparison result is that the read data corresponding to a plurality of the read addresses and the expected values are not identical, sequentially reads a grouping of at least one read address and the fail data stored in the first fail memory during testing and updates the fail data stored in the second fail memory corresponding to the at least one read address after completion of a test stored in the first fail memory of the grouping of the read address and the fail data.

4. The test apparatus according to claim 1, further comprising a storage control section operable to prohibit subsequent storage of a grouping of the read address and the fail data to the first fail memory on a condition that a number of the groupings of the read address and the fail data stored in the first fail memory reaches a previously set maximum value.

5. The test apparatus according to claim 4, wherein the storage control section:
   executes a comparison of the read data corresponding to a plurality of the read addresses and the expected values and, in a case where a comparison result is that the read data corresponding to a plurality of the read addresses and the expected values are not identical, prohibits subsequent storage of the grouping of the read address and the fail data to the first fail memory on the condition that the number of the groupings of the read address and the fail data stored in the first fail memory reaches the previously set maximum value during a test sequentially storing in the first fail memory the grouping of the read address and the fail data; and
   performs the test again after updating of the second fail memory with the grouping of the read address and the fail data stored in the first fail memory and stores in the first fail memory a grouping of the read address and the fail data prohibited from being stored in the first fail memory during the previous performance of the test.

6. The test apparatus according to claim 5, wherein the storage control section:
   stores a test cycle in which the number of the groupings of the read address and the fail data stored in the first fail memory reaches the previously set maximum value; and
   allows subsequent storage of a grouping of the read address and the fail data in the first fail memory on a condition that a test cycle in the test that is performed again reaches the stored test cycle.

7. The test apparatus according to claim 1, wherein the updating section, in a case where a first read address and a second read address stored in the first fail memory are identical:
   reads the fail data stored in the first read address of the second fail memory;
   obtains the first fail data corresponding to the first read address read from the first fail memory, a second fail data corresponding to the second read address, and a logical sum of the fail data read from the second fail memory and generates new fail data in which a "fail" result is determined where at least one of the bits in the fail data indicates "fail"; and
   writes the new fail data to the first read address of the second fail memory.

8. The test apparatus according to claim 1, wherein the first fail memory and the second fail memory are disposed in different address ranges within the same memory device.

9. The test apparatus according to claim 8, wherein the storage capacity of the first fail memory and the second fail memory in the memory device is changeable within a range in which the total storage area of the first fail memory and the second fail memory does not exceed a storage area of the memory device.

10. An electronic device comprising a memory circuit operating according to a signal input into a device during operation of the device; and a test circuit for testing the memory circuit, the test circuit including:
    a pattern generator operable to generate a read address from which data is read from the memory circuit and an expected value of the read data read from the read address of the memory circuit;

a logical comparator operable to compare read data read from the read address of the memory circuit to the expected value and outputting fail data indicating pass/fail of every bit of the read data;

a first fail memory operable to store a grouping of the read address and the fail data only in a case where the read data is not identical to the expected value;

a second fail memory operable to store fail data in addresses corresponding to each address of the memory circuit; and an updating section operable to update the fail data stored in the second fail memory and corresponding to the read address based on the fail data read from the first fail memory that is in the same grouping as the read address.

11. The electronic device according to claim 10, wherein the updating section:

reads the fail data stored in the second fail memory and corresponding to the read address read from the first fail memory;

obtains a logical sum of corresponding bits in the fail data read from the first fail memory and the fail data read from the second fail memory and generates new fail data in which a "fail" result is determined where at least one of the bits in the fail data indicates "fail"; and writes the new fail data to the read address of the second fail memory.

12. The electronic device according to claim 11, wherein the updating section executes a comparison of the read data corresponding to a plurality of the read addresses and the expected values and, in a case where a comparison result is that the read data corresponding to a plurality of the read addresses and the expected values are not identical, sequentially reads a grouping of at least one read address and the fail data stored in the first fail memory during testing and updates the fail data stored in the second fail memory corresponding to the at least one read address after completion of a test storing in the first fail memory the grouping of the read address and the fail data.

13. The electronic device according to claim 10, further comprising a storage control section operable to prohibit subsequent storage of a grouping of the read address and the fail data to the first fail memory on a condition that a number of the groupings of the read address and the fail data stored in the first fail memory reaches a previously set maximum value.

14. The electronic device according to claim 13, wherein the storage control section:

executes a comparison of the read data corresponding to a plurality of the read addresses and the expected values and, in a case where a comparison result is that the read data corresponding to a plurality of the read addresses and the expected values are not identical, prohibits subsequent storage of the grouping of the read address and the fail data to the first fail memory on the condition that the number of the groupings of the read address and the fail data stored in the first fail memory reaches the previously set maximum value during a test sequentially storing in the first fail memory the grouping of the read address and the fail data; and performs the test again after updating of the second fail memory with the grouping of the read address and the fail data stored in the first fail memory and stores in the first fail memory a grouping of the read address and the fail data prohibited from being stored in the first fail memory during the previous performance of the test.

15. The electronic device according to claim 14, wherein the storage control section:

stores a test cycle in which the number of the groupings of the read address and the fail data stored in the first fail memory reaches the previously set maximum value; and allows subsequent storage of a grouping of the read address and the fail data in the first fail memory on a condition that a test cycle in the test that is performed again reaches the stored test cycle.

16. The electronic device according to claim 10, wherein the updating section, in a case where a first read address and a second read address stored in the first fail memory are identical:

reads the fail data stored in the first read address of the second fail memory;

obtains the first fail data corresponding to the first read address read from the first fail memory, a second fail data corresponding to the second read address, and a logical sum of the fail data read from the second fail memory and generates new fail data in which a "fail" result is determined where at least one of the bits in the fail data indicates "fail"; and writes the new fail data to the first read address of the second fail memory.

17. The electronic device according to claim 10, wherein the first fail memory and the second fail memory are disposed in different address ranges within the same memory device.

18. The electronic device according to claim 17, wherein the storage capacity of the first fail memory and the second fail memory in the memory device is changeable within a range in which the total storage capacity of the first fail memory and the second fail memory does not exceed a storage capacity of the memory device.

19. A test apparatus for testing a memory under test, comprising:

a pattern generator operable to generate a read address from which data is read from the memory under test and an expected value of the read data read from the read address of the memory under test;

a logical comparator operable to compare read data read from the read address of the memory under test to the expected value and outputting fail data indicating pass/fail of every bit of the read data;

a first fail memory operable to store a grouping of the read address and the fail data in a case where the read data is not identical to the expected value;

a second fail memory operable to store fail data in addresses corresponding to each address of the memory under test; and an updating section operable to update fail data stored in the second fail memory and corresponding to the read address based on the fail data read from the first fail memory that is in the same grouping as the read address, wherein the updating section:

reads the fail data stored in the second fail memory and corresponding to the read address read from the first fail memory;

obtains a logical sum of corresponding bits in the fail data read from the first fail memory and the fail data read from the second fail memory and generates new fail data in which a "fail" result is determined where at least one of the bits in the fail data indicates "fail"; and writes the new fail data to the read address of the second fail memory.

20. The test apparatus according to claim 19, wherein the updating section executes a comparison of the read data corresponding to a plurality of the read addresses and the expected values and, in a case where a comparison result is that the read data corresponding to a plurality of the read addresses and the expected values are not identical, sequentially reads a grouping of at least one read address and the fail data stored in the first fail memory during testing and updates the fail data stored in the second fail memory corresponding to the at least one read address after completion of a test stored in the first fail memory of the grouping of the read address and the fail data.

21. An electronic device comprising a memory circuit operating according to a signal input into a device during operation of the device; and a test circuit for testing the memory circuit, the test circuit including:
- a pattern generator operable to generate a read address from which data is read from the memory circuit and an expected value of the read data read from the read address of the memory circuit;
- a logical comparator operable to compare read data read from the read address of the memory circuit to the expected value and outputting fail data indicating pass/fail of every bit of the read data;
- a first fail memory operable to store a grouping of the read address and the fail data in a case where the read data is not identical to the expected value;
- a second fail memory operable to store fail data in addresses corresponding to each address of the memory circuit; and
- an updating section operable to update the fail data stored in the second fail memory and corresponding to the read address based on the fail data read from the first fail memory that is in the same grouping as the read address, wherein the updating section:
  - reads the fail data stored in the second fail memory and corresponding to the read address read from the first fail memory;
  - obtains a logical sum of corresponding bits in the fail data read from the first fail memory and the fail data read from the second fail memory and generates new fail data in which a "fail" result is determined where at least one of the bits in the fail data indicates "fail"; and
  - writes the new fail data to the read address of the second fail memory.

22. The electronic device according to claim 21, wherein the updating section executes a comparison of the read data corresponding to a plurality of the read addresses and the expected values and, in a case where a comparison result is that the read data corresponding to a plurality of the read addresses and the expected values are not identical, sequentially reads a grouping of at least one read address and the fail data stored in the first fail memory during testing and updates the fail data stored in the second fail memory corresponding to the at least one read address after completion of a test storing in the first fail memory the grouping of the read address and the fail data.

* * * * *